United States Patent [19]

Tamura

[11] Patent Number: 4,900,690
[45] Date of Patent: Feb. 13, 1990

[54] MOS SEMICONDUCTOR PROCESS WITH DOUBLE-LAYER GATE ELECTRODE STRUCTURE

[75] Inventor: Hiroyuki Tamura, Tokyo, Japan

[73] Assignee: OKI Electric Industry Co., Ltd., Tokyo, Japan

[21] Appl. No.: 240,729

[22] Filed: Sep. 6, 1988

[30] Foreign Application Priority Data

Sep. 7, 1987 [JP] Japan .................................. 62-221840

[51] Int. Cl.$^4$ .......................................... H01L 21/316
[52] U.S. Cl. ........................................ 437/43; 437/41; 437/49; 437/195; 437/193
[58] Field of Search ........................ 437/43, 41, 42, 49, 437/50, 193, 190, 195, 47, 918; 357/23.5, 71

[56] References Cited

U.S. PATENT DOCUMENTS

| | | | |
|---|---|---|---|
| 4,367,580 | 1/1983 | Guterman | 437/195 |
| 4,373,249 | 2/1983 | Kosa et al. | 437/195 |
| 4,533,935 | 8/1985 | Mochizuki | 357/71 |
| 4,816,425 | 3/1989 | McPherson | 437/195 |

FOREIGN PATENT DOCUMENTS 0007947 1/1982 Japan ...................................... 437/43

OTHER PUBLICATIONS

Hori, T., et al., "Improvement of Dielectric Strength . . . ", VLSI Symposium 1987, pp. 63–64.

Primary Examiner—Brian E. Hearn
Assistant Examiner—T. N. Quach
Attorney, Agent, or Firm—Wenderoth, Lind & Ponack

[57] ABSTRACT

A MOS semiconductor device with a double-layer gate electrode structure includes a silicon substrate and a field oxide layer which is selectively formed on one major surface of the substrate in such a manner as to surround an active region. A first silicon oxide layer is deposited in a region of a gate electrode of the semiconductor device. A polycrystalline silicon layer is provided on the first silicon layer and in a portion which extends from the region of the gate electrode to above the field oxide layer. Source and drain diffusion regions are defined in a part of the active region of the major surface of the substrate. An impurity-doped second silicon oxide layer is deposited on the entire surface of a laminate which is constituted by the substrate to the source and drain diffusion regions except for the surface of that portion of the polycrystalline silicon layer which overlies the field oxide layer. A conductive layer is provided on that portion of the second silicon oxide layer which is associated with the region of the gate electrode and extending to above and being connected to that portion of the polycrystalline silicon layer which overlies the field oxide layer. Further, an impurity-doped third silicon oxide layer is deposited on the entire surface of a laminate constituted by the substrate to the conductive layer. A wiring is connected to the source and drain diffusion regions and gate electrode by contact holes which are formed in the third silicon oxide layer.

8 Claims, 7 Drawing Sheets

MOS SEMICONDUCTOR PROCESS WITH DOUBLE-LAYER GATE ELECTRODE STRUCTURE

BACKGROUND OF THE INVENTION

1. Field of the Invention

The present invention relates to a MOS semiconductor device and, more particularly, to a MOS semiconductor device of the type including a gate electrode which has a double-layer structure and a method of fabricating such a MOS semiconductor device.

2. Description of the Prior Art

There has been introduced in the semiconductor devices art a MOS semiconductor device having a gate electrode layer which is produced by laminating two sublayers on a gate oxide layer of a MOS transistor. Such a double-layer gate electrode includes a polycrystalline silicon oxide or polycide layer deposited on the gate oxide layer and a low resistance layer deposited on the polycide layer. The lower resistance layer contains silicide such as $WSiO_2$, $MoSi_2$, $TaSi_2$ or $TiSi_2$ or metal such as W, Mo, Ta or Ti. This double-layer structure is covered with a phosphor-doped silicon oxide layer, and the electrode layer is electrically connected to source and drain regions via contact holes which are formed in the phosphor-doped silicon oxide layer. A prerequisite with a gate electrode layer is that it has sufficiently low resistance. Such low resistance is usually attained by subjecting a dopd polycrystalline silicon layer and a low resistance layer which in combination constitute a gate electrode layer to heat treatment. Especially, as the integration density becomes higher, the gate electrode layer having a strip-like configuration becomes narrower and therefore the heat treatment for lowering the resistance is indispensable. A problem with such heat treatment is that it is apt to cause the two sublayers of the gate electrode layer to react on each other.

Generally, a prerequisite with a semiconductor IC device having high integration density is that the undulation on the surface of the device be reduced to prevent a wiring layer provided on that surface from being broken due to the undulation. To meet this requirement, the double-layer gate electrode structure should preferably be configured such that the polycrystalline silicon layer which constitutes the gate electrode layer has a minimum of thickness. A dilemmatic situation, however, is that reducing the thickness of the doped polycrystalline silicon layer is apt to cause mechanical stresses to act on a gate insulating layer during the course of heat treatment which is effected to lower the resistance as previously stated, resulting in a decrease in gate breakdown voltage.

A higher gate breakdown voltage is achievable with a gate electrode structure in which a gate electrode layer includes a polycrystalline silicon layer deposited on a silicon oxide layer, a barrier layer of $WSi_x$ or SiN deposited on the silicon layer, and a $TiSi_x$ layer provided on the barrier layer, as taught by T. Hori et al. in "Improvement of Dielectric Strength of $TiSi_x$-Polycide-Gate System by Using Rapidly Nitrided Oxides," VLSI Symposium 87, pp. 63–64. In this kind of structure, electrical connection or contact is set up on the uppermost $TiSi_x$ layer by a wiring of aluminum. However, such a gate electrode structure has a drawback that the $WSi_x$ layer and the barrier layer of SiN or similar compound are extremely thin and therefore the thickness control during fabrication is difficult. Moreover, since the electrical contact is set up at a position just above the gate electrode, weak spots developed in the barrier layer immediately lead to the degradation of MOS characteristics.

SUMMARY OF THE INVENTION

It is therefore an object of the present invention to provide a MOS semiconductor device which minimizes the reaction between two sublayers of a gate electrode layer as well as the decrease in gate breakdown voltage, and a method of producing such a MOS semiconductor device.

A method of fabricating a MOS semiconductor device of the present invention comprises the steps of (a) preparing a silicon substrate, (b) selectively forming a field oxide layer on one of opposite major surfaces of the substrate in such a manner as to surround an active region, (c) forming a first silicon oxide layer in the active region, (d) forming a polycrystalline silicon layer on the first silicon oxide layer, (e) selectively removing a part of the first silicon oxide layer and polycrystalline silicon layer such that the two layers are left in a region of a gate electrode of the device and in a portion which extends from the region of the gate electrode to above the field oxide layer, (f) forming source and drain diffusion regions in the major surface of the substrate, (g) depositing a second silicon oxide layer doped with an impurity on an entire surface of a laminate which is produced by step (f) and flattening a surface of the second silicon oxide layer, (h) etching the flattened entire surface until a surface of that portion of the polycrystalline silicon layer which overlies the oxide layer becomes bare, (i) forming a conductive layer on the entire surface of a laminate which is produced by step (h), (j) selectively removing a part of the conductive layer such that the layer is left in a region associated with the gate electrode and a portion associated with that portion of the polycrystalline silicon layer which extends to above the field oxide layer, (k) depositing a third silicon oxide layer doped with an impurity on the entire surface of a laminate which is produced by step (j), and (l) forming contact holes in the third silicon oxide layer and forming a wiring which connects to the source and drain diffusion regions and gate electrode via the contact holes.

A MOS semiconductor device of the present invention comprises a silicon substrate, a field oxide layer selectively formed on one of opposite major surfaces of the substrate in such a manner as to surround an active region, a first silicon oxide layer formed in a region of a gate electrode of the device, a polycrystalline silicon layer formed on the first silicon oxide layer and in a portion which extends from the region of the gate electrode to above the field oxide layer, source and drain diffusion regions formed in a part of the active region of the major surface of the substrate, a second silicon oxide layer doped with an impurity and deposited on the entire surface of a laminate constituted by the substrate to the source and drain diffused regions except for the surface of that portion of the polycrystalline silicon layer which overlies the field oxide layer, a conductive layer formed on that portion of the second silicon oxide layer which is associated with the region of the gate electrode and extending to above and being connected to that portion of the polycrystalline silicon layer which overlies the field oxide layer, a third silicon oxide layer doped with an impurity and deposited on the entire surface a laminate constituted by the substrate to the conductive layer, and a wiring connected to the source and drain diffusion regions and gate electrode by contact holes which are formed in the third silicon oxide layer.

In accordance with the present invention, a single thermally stable layer is interposed between two layers which constitute a gate electrode, and heat treatment is applied to the double-layer structure chemical reactions of the two layers. This effectively prevents the gate breakdown voltage from being lowered. Further electrical contact between the two layers is set up in a field region and not immediately above a gate, so that the decrease in the gate breakdown voltage due to weak spots which are apt to occur in a barrier layer is eliminated.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

To better understand the present invention, a brief reference will be made to a prior art method of fabricating a MOS semiconductor device having a double-layer gate electrode structure, shown in FIGS. 1A to 1E.

Figure 1A:
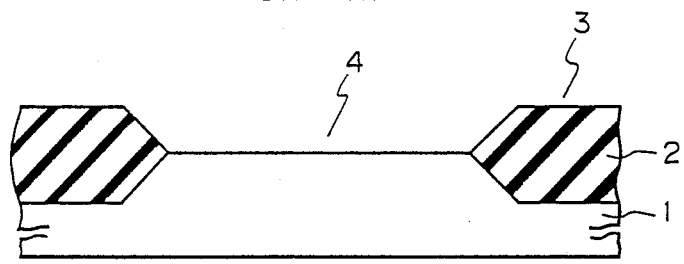
FIGS. 1A to 1E and 2A to 2E are end sections exemplarily showing two different prior art sequences of steps for fabricating a MOS semiconductor device having a double-layer gate structure.

As shown in FIG. 1A, the procedure begins with preparing a silicon substrate and selectively forming a substantially 4000 to 6000 angstrom thick field oxide layer 2 on one of opposite major surfaces of the substrate 1. The field oxide layer 2 divides the major surface of the substrate 1 into a field region 3 and an active region 4. To form the field oxide layer 2, use is made of selective oxidization in which a nitrided layer, not shown, produced by vacuum gas-phase growth is used for masking. In the active region 4, the field oxide layer 2 is absent so that the surface of the silicon substrate 1 is left bare.

Figure 1B:
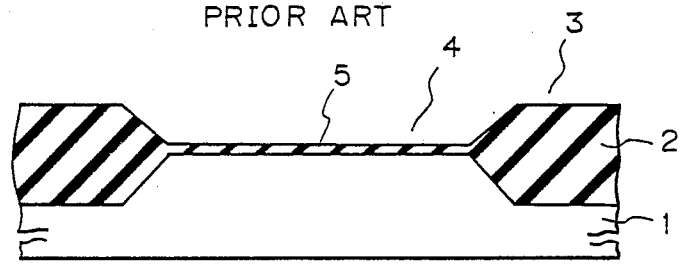

As shown in FIG. 1B, a silicon oxide layer 5 is grown in the active region 4 by a thickness of 200 to 400 angstroms by dry oxidization which is effected at a temperature of 800 to 1000 degrees centigrade.

Subsequently, a 2000 to 4000 angstrom thick polycrystalline silicon oxide or polycide layer 6 is grown on the silicon oxide layer 5 by vacuum gas-phase growth. This is followed by depositing on the polycide layer 6 a 2000 to 4000 angstrom thick low resistance layer 7 of silicide such as $WSiO_2$, $MoSi_2$, $TaSi_2$ or $TiSi_2$ or of metal such as W, Mo, Ta or Ti. The resulting double-layer structure (polycide structure) is removed by photoetching except for those portions of the structure which are associated with channel regions of a MOS transistor to be provided in the active region 4. Thereafter, As atoms are implanted at a density of substantially $1 \times 10^{16}$ cm$^{-2}$ to produce source and drain diffusion layers 8. A configuration produced by the process steps described so far is shown in FIG. 1C.

Figure 1C:
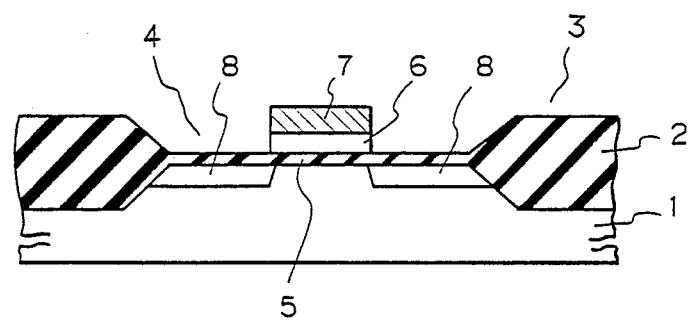
Figure 1D:
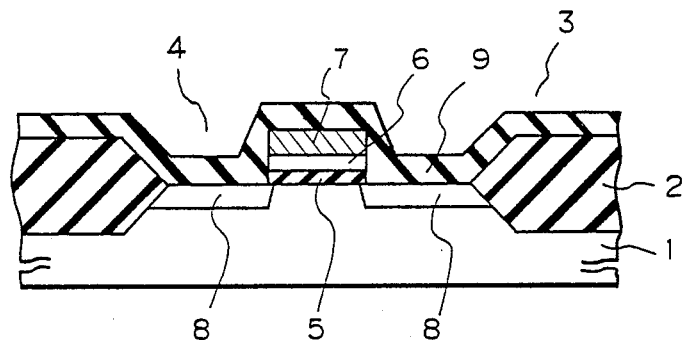
Figure 1E:
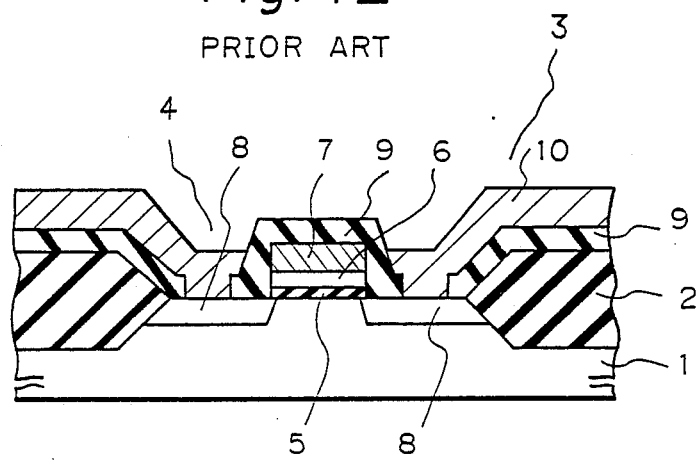

As shown in FIG. 1D, a 5000 to 8000 angstrom thick phosphor-doped oxide layer 9 is formed on the laminate of FIG. 1C to serve as an intermediate insulating layer. Then, contact holes are formed in the silicon oxide layer 9 above the low resistance layer or gate electrode 7 and above the source and drain diffusion layers 8 by photoetching. After this, as shown in FIG. 1E, a wiring layer 10 of metal such as aluminum is deposited by a thickness of 6000 to 8000 angstroms and patterned. This provides a wiring 10 which connects to the gate electrode 7 and source and drain diffusion layers 8 via the above-mentioned contact holes.

The prior art method of fabricating a MOS semiconductor device described above is not satisfactory because the gate electrode is implemented as a combination of a silicide or metal layer and a polycrystalline silicon layer. In such a double-layer gate electrode structure, the two layers react on each other during the course of heat treatment and, therefore, the gate breakdown voltage is lowered if the polycrystalline silicon layer is thin.

Figure 2A:
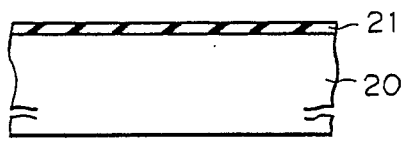
Figure 2B:
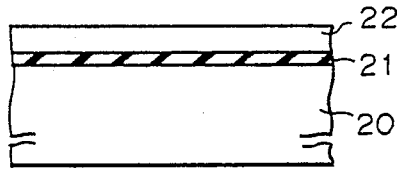

The structure proposed by T. Hori et al. in the previously mentioned paper for eliminating the above problem will be described with reference to FIGS. 2A to 2E. First, as shown in FIG. 2A, a 9.9 nanometer thick oxide layer 21 is provided on a p-type silicon substrate 20. Then, as shown in FIG. 2B, a 100 nanometer thick n+ polysilicon layer 22 is deposited on the oxide layer 21. This is followed by depositing on the silicon layer 22 a 0.25 nanometer thick $WSi_x$ layer 23 and a 200 nanometer thick $TiSi_x$ layer 24 by simultaneous sputtering, as shown in FIG. 2C.

Figure 2C:
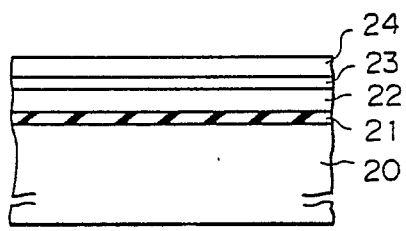
Figure 2D:
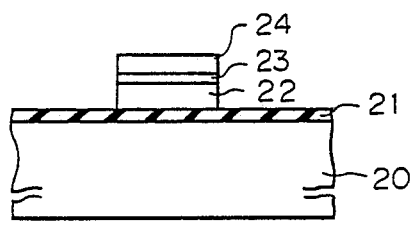
Figure 2E:
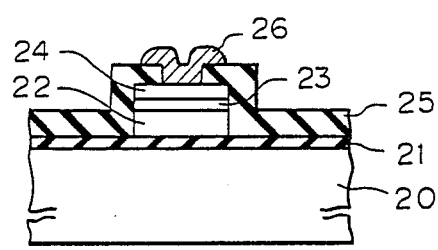

As shown in FIG. 2D, the laminate of FIG. 2C is patterned by dry etching while leaving a gate electrode region thereof and, then, annealed at 900 degrees centigrade for 30 minutes in an $N_2$ atmosphere. As shown in FIG. 2E, this prior art procedure ends with depositing an $SiO_2$ layer 25 on the resulting laminate and then providing an aluminum wiring 26 which connects to the gate.

The prior art procedure described above with reference to FIGS. 2A to 2E has a drawback that the thickness of the $WSi_x$ layer or barrier layer 23 cannot be controlled with ease, as discussed earlier. Another shortcoming is that weak spots which are apt to exist in the barrier layer 23 degrade the MOS characteristics because the electrical contact is set up on the gate electrode 24, as also stated earlier.

Figure 3A:
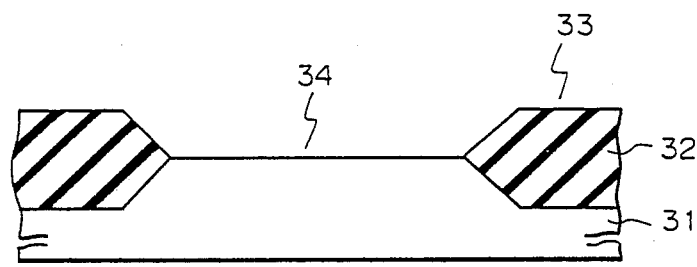
FIGS. 3A to 3H are end sections showing a sequence of steps for fabricating a double-layer gate electrode type MOS semiconductor device embodying the present invention.

A preferred embodiment of the present invention will be described in detail with reference to FIGS. 3A to 3H and 4A to 4D. As shown in FIGS. 3A, a p-type silicon substrate 31 is prepared and one of its major surfaces is divided into a field region 33 and an active region 34 by a field oxide layer 32. This process step may be the same as that of any of the prior art procedures shown and described. For example, a nitrided layer, not shown, is formed by vacuum gas-phase growth and then a substantially 4000 to 6000 angstrom field oxide layer is deposited by selective oxidation which uses the nitrided layer as a mask. The active region 34 is left bare on the major surface of the substrate 31 so as to allow a desired MOS transistor to be formed therein. More specifically, the active region 34 is provided in the form of an opening which may have a generally rectangular configuration and is surrounded by the field oxide layer 32.

Figure 3B:
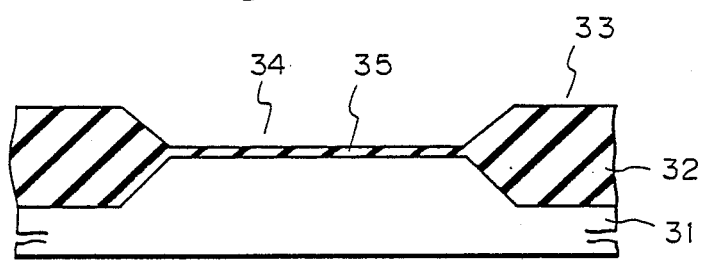

As shown in FIG. 3B, a 200 to 400 angstrom thick gate silicon oxide layer 35 is grown in the active region 34 by dry oxidation. Then, a polycrystalline silicon layer 36 which has been doped with phosphor or similar impurity is grown on the silicon oxide layer 35 to a thickness of 2000 to 4000 angstroms by vacuum gas-phase growth. The purpose of doping the silicon layer 36 with an impurity such as phosphor is to provide the silicon layer 36 with conductivity. Thereafter, the polycrystalline silicon layer 36 and gate oxide layer 35 are removed by photoetching except for their portion which should constitute a gate electrode of the MOS semiconductor device. This is followed by implanting As ions by a density of approximately $1 \times 10^{16}$ cm$^{-2}$ and annealing the laminate at a temperature of 900 to 1000 degrees centigrade. As a result, n-type source and drain diffusion layers 37 each having a desired depth are formed, as shown in FIG. 3C.

Figure 3C:
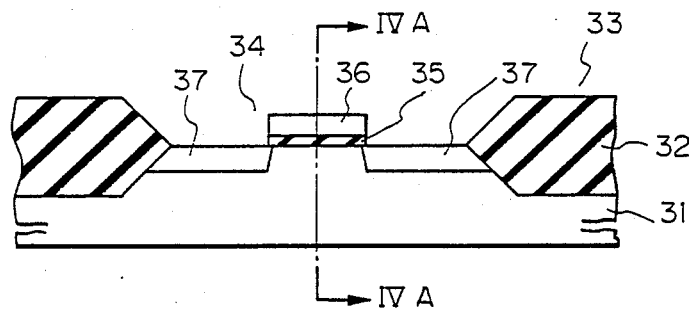
Figure 4A:
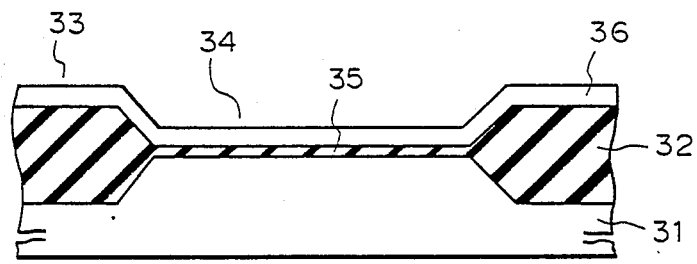
FIGS. 4A to 4D are sections along dash-and-dot lines of FIGS. 3C to 3F, respectively.

As shown in FIG. 4A which is a section along line IVA—IVA of FIG. 3C, the polycrystalline silicon layer 36 extends from the active region 34 over to the top of the field oxide layer 32. More specifically, the field oxide layer 32 surrounds the opening of the active region 34 which is generally rectangular in the illustrative embodiment. As previously stated, when the polycrystalline silicon layer 36 and gate oxide layer 35 are to be removed by photoetching except for the gate portion, the silicon layer 36 is left unremoved in a direction perpendicular to the sheet surface of FIG. 3C i.e., a direction parallel to the sheet surface of FIG. 4A inclusive of the area above the field oxide layer 32. This forms the polycrystalline silicon layer 36 in the form of a strip, as shown in FIG. 4A.

Figure 3D:
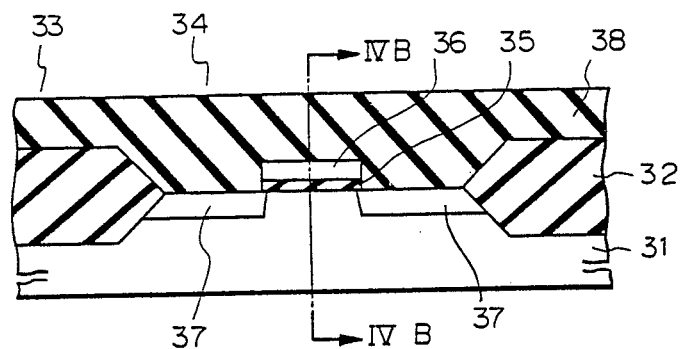
Figure 4B:
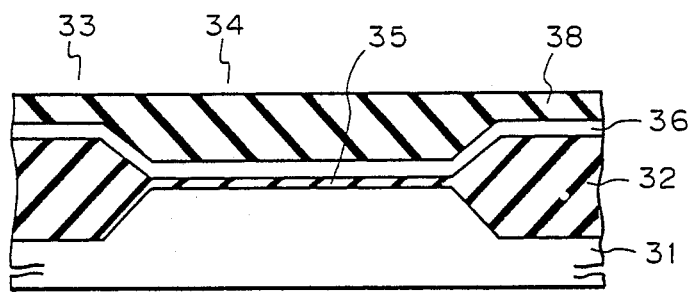

As shown in FIG. 3D, a 4000 to 7000 angstrom insulating layer 38 is formed on the laminate of FIG. 3C by gas-phase growth. The insulating layer 38 may be implemented by a boron-doped silicon oxide layer (BSG) or an arsenic-doped silicon oxide layer (AsSG) the surface of which is capable of being made flat when treated at a temperature of 800 to 900 degrees centigrade. Then, the insulating layer 38 is treated at a temperature of 800 to 900 degrees centigrade to have a flat surface. As shown in FIG. 4B which is a section along line IVB—IVB of FIG. 3D, the insulating layer 38 is also deposited in the field region 33.

Figure 3E:
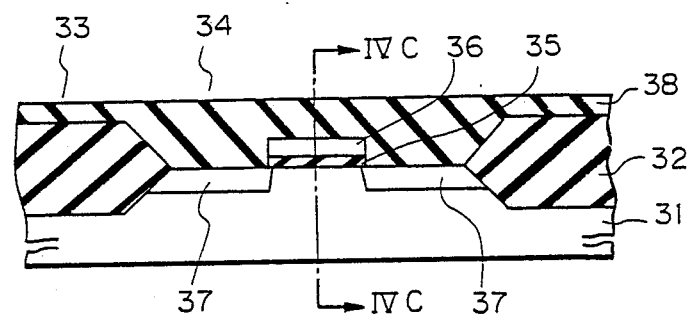
Figure 4C:
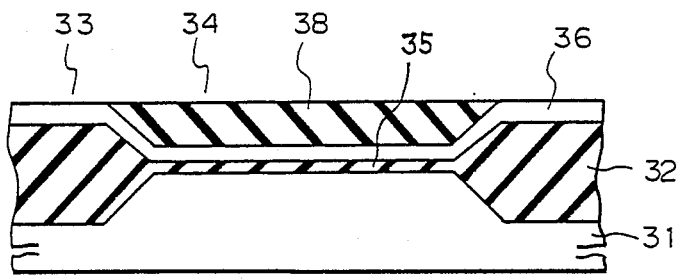

The step of FIG. 3D is followed by a step shown in FIG. 3E, i.e., removing the entire surface of the insulating layer 38 by a depth of approximately 2000 to 3000 angstroms by isotropic etching which uses etching gas. As shown in FIG. 4C which is a section along line IVC—IVC of FIG. 3E, such isotropic etching is executed such that the surface of the polycrystalline silicon layer 36 in the field region 33 shows itself to the outside.

Figure 3F:
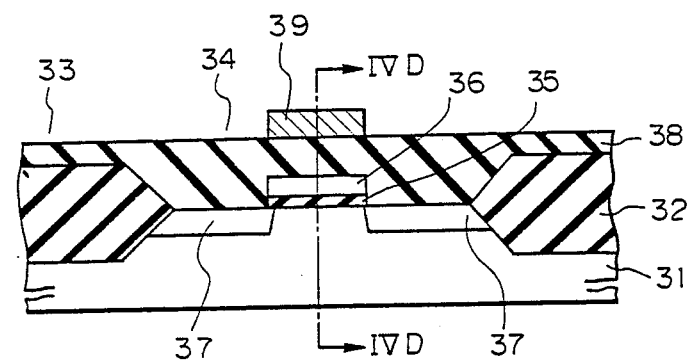
Figure 4D:
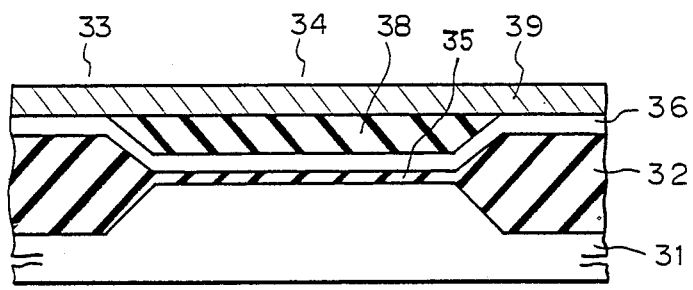

Afterwards, a conductive or low resistance layer 39 of silicide such as $WSi_2$, $MoSi_2$, $TaSi_2$ or $TiSi_2$ or of metal such as W, Mo, Ta or Ti is deposited on the surface of the insulating layer 38 by a thickness of 2000 to 4000 angstroms. Then, the low resistance layer 39 is patterned by photoetching such that a gate electrode portion is left unremoved, as shown in FIG. 3F. FIG. 4D is a section along line IVD—IVD of FIG. 3F. As shown in FIG. 4D, the electrical contact of the polycrystalline silicone layer 36 with the low resistance layer 39 is set up in the field region 33 by such a configuration of the low layer 39. This eliminates the possibility of mechanical stresses being applied to a gate insulating film as has heretofore been encountered. It is to be noted that the above-mentioned photoetching may be implemented by the same mask as is used to pattern the polycrystalline silicon layer 36.

Figure 3G:
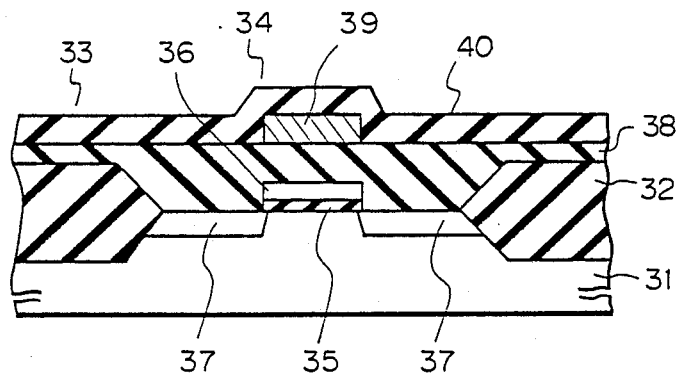
Figure 3H:
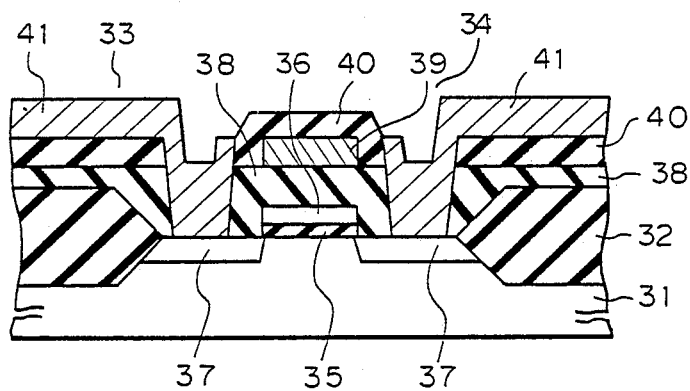

As shown in FIG. 3G, a 4000 to 6000 angstroms thick silicon oxide layer 40 doped with P, As, B or similar impurity is formed on the laminate of FIG. 3F to serve as an insulating layer. Then, contact holes are formed by photoetching in those positions where the gate electrode and the source and drain diffusion regions 37 are accessible. After the contact holes have been formed, a wiring layer 41 of aluminum or similar metal is deposited by a thickness of 6000 to 8000 angstroms and then patterned. As a result, a wiring which connects to the gate electrode and the source and drain diffusion layers 37 via the contact holes is completed, as shown in FIG. 3H.

In summary, in accordance with the present invention, the stable layer 38 is provided between the conductive layer 39 and the polycrystalline silicon layer 36 which in combination constitute a gate electrode, suppressing chemical reactions which would otherwise occur between the two layers 39 and 36 during the course of heat treatment. Hence, the gate breakdown voltage is prevented from being lowered. Further, since electrical connection between the two layers 36 and 39 is set up in the field region 33, contact holes heretofore formed in an interlayer film of a gate electrode and therefore an extra step for forming them is not necessary. The resulting MOS transistor therefore suffers from a minimum of change in threshold value VT and a minimum of leak current, promoting the fabrication of a highly reliable semiconductor device.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A method of fabricating a MOS semiconductor device, comprising the steps of:
   (a) preparing a silicon substrate;
   (b) selectively forming a field oxide layer on one of opposite major surfaces of said substrate in such a manner as to surround an active region;
   (c) forming a first silicon oxide layer in said active region;
   (d) forming a polycrystalline silicon layer on said first silicon oxide layer;
   (e) selectively removing a part of said first silicon oxide layer and polycrystalline silicon layer such that said layers are left in a region of a gate electrode of said device and in a portion which extends from said region of said gate electrode to above said field oxide layer;
   (f) forming source and drain diffusion regions in said major surface of said substrate;
   (g) depositing a second silicon oxide layer doped with an impurity on an entire surface of a laminate which is produced by step (f), and flattening a surface of said second silicon oxide layer;
   (h) etching said flattened entire surface until a surface of that portion of said polycrystalline silicon layer which overlies said field oxide layer becomes bare;
   (i) forming a conductive layer on an entire surface of a laminate which is produced by step (h);
   (j) selectively removing a part of said conductive layer such that said layer is left in a region associated with said gate electrode and a portion associated with that portion of said polycrystalline silicon layer which extends to above said field oxide layer;

(k) depositing a third silicon oxide layer doped with an impurity on an entire surface of laminate which is produced by step (j); and (l) forming contact holes in said third silicon oxide layer and forming a wiring which connects to said source and drain diffusion regions and said gate electrode via said contact holes.

2. A method in accordance with claim 1, wherein step (a) compises preparing a silicon substrate having p-type conductivity while step (f) comprises forming source and drain diffusion layers each having n-type conductivity, whereby an n-channel MOS transistor is formed in said active region.

3. A method in accordance with claim 1, wherein step (d) comprises doping said polycrystalline silicon layer with phosphor.

4. A method in accordance with claim 2, wherein step (f) comprises implanting As ions in said major surface of said substrate to form said n-type source and drain diffusion regions.

5. A method in accordance with claim 2, wherein the impurity doped at step (g) comprises one of boron and arsenic.

6. A method in accordance with claim 2, wherein said conductive layer formed at step (i) is formed from one of silicide and metal.

7. A method in accordance with claim 6, wherein the silicide is selected from a group consisting of $WSi_2$, $MoSi_2$, $TaSi_2$ and $TiSi_2$ while the metal is selected from a group consisting of W, Mo, Ta and Ti.

8. A method in accordance with claim 2, wherein the impurity doped at step (k) is selected from a group consisting of phosphor, boron and arsenic.

* * * * *